(12) United States Patent
Amanai

(10) Patent No.: US 6,177,824 B1
(45) Date of Patent: Jan. 23, 2001

(54) LEVEL SHIFTING CIRCUIT

(75) Inventor: Masakazu Amanai, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/275,030

(22) Filed: Mar. 24, 1999

(30) Foreign Application Priority Data

Mar. 24, 1998 (JP) .................................................. 10-075618

(51) Int. Cl.[7] .................................................. H03L 5/00
(52) U.S. Cl. .......................................... 327/333; 327/319
(58) Field of Search .................................. 327/318, 319, 327/333; 326/80, 81

(56) References Cited

U.S. PATENT DOCUMENTS

| 4,689,504 | 8/1987 | Raghunathan et al. | 307/449 |
| 4,996,443 | 2/1991 | Tateno | 307/264 |
| 5,619,150 | 4/1997 | Briner | 327/55 |
| 5,933,043 | * 8/1999 | Utsunomiya et al. | 327/333 |
| 6,049,243 | * 4/2000 | Mihara et al. | 327/333 |

FOREIGN PATENT DOCUMENTS

| 0 703 665 | 3/1996 | (EP) . |
| 0 765 035 | 3/1997 | (EP) . |
| 0 798 860 | 10/1997 | (EP) . |

OTHER PUBLICATIONS

"5–Volt Signal Level Shifter in a 3–Volt CMOS Circuit," IBM Technical Disclosure Bulletin, (XP000078153), vol. 32, No. 7, pp. 454–455 (Dec. 1, 1989).

* cited by examiner

*Primary Examiner*—Jeffrey Zweizig
(74) *Attorney, Agent, or Firm*—Foley & Lardner

(57) ABSTRACT

A semiconductor device comprises a level shifting circuit that can be achieved without using an extra charge pump and using low voltage transistors. The level shifting circuit 10 controls the on/off state of a transfer gate, which is an n-channel transistor N1. The level shifting circuit 10 has a NAND gate 11 to which the voltage mode selection signal HVON and input signal IN are given; the p-channel transistor P2, the n-channel transistor N4, and the n-channel transistor N6 series connected between the NAND gate 11 output and the −9V charge pump output Vncp; a NAND gate 13 to which the voltage mode selection signal HVON is input, and input signal IN is input through inverter 12; and the p-channel transistor P3, the n-channel transistor N5, and the n-channel transistor N7 series connected between the NAND gate 13 output and the charge pump output Vncp.

20 Claims, 6 Drawing Sheets

| HVON | −9V CHARGE PUMP OUTPUT | −4V CHARGE PUMP OUTPUT | IN | A | LSO | OUT |
|---|---|---|---|---|---|---|
| L | 0V | 0V | L | 0V | 0V | Hi-Z |
| | | | H | Vdd | Vdd | 0V |
| H | −9V | −4V | L | −4V | −9V | Hi-Z |
| | | | H | Vdd | 0V | −9V |

| HVON | Vncp | Vbias | IN | a1 | a2 | b1 | b2 | LSO |
|---|---|---|---|---|---|---|---|---|
| L | 0V | Vdd | L | Vdd | Vdd | Vdd−Vtn | 0V | 0V |
| | | | H | | | 0V | Vdd−Vtn | Vdd |
| H | −9V | Vtn | L | Vdd | 0V | 0V | −9V | −9V |
| | | | H | 0V | Vdd | −9V | 0V | Vdd |

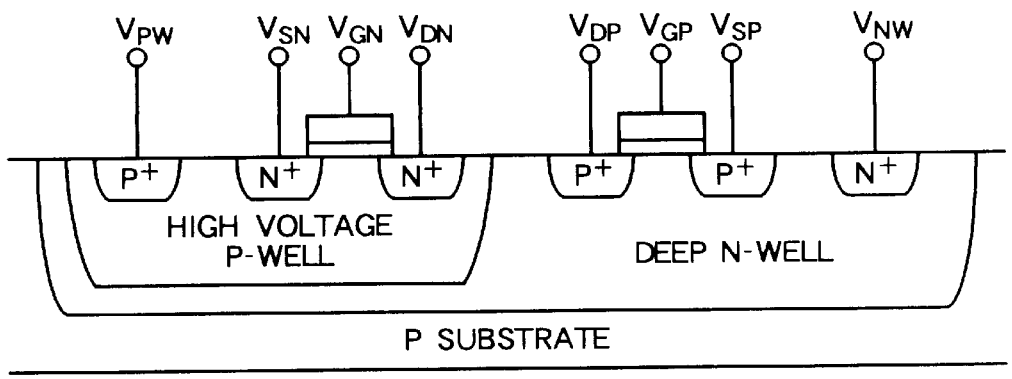
FIG. 8
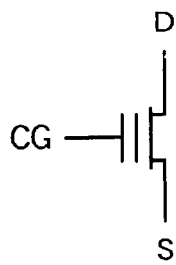
FIG. 9
| | WRITE | | ERASE | | READ | |
|---|---|---|---|---|---|---|
| | SELECTION | NON-SELECTION | SELECTION | NON-SELECTION | SELECTION | NON-SELECTION |
| D | 6V OR 0V | 0V | OPEN | OPEN | 1V | 0V |
| CG | −9V | 0V | 11V | 0V | Vdd | 0V |
| S | OPEN | OPEN | −4V | −4V | 0V | 0V |
FIG. 10

LEVEL SHIFTING CIRCUIT

BACKGROUND OF THE INVENTION

1. Field of the Invention

The present invention relates to a semiconductor device, and relates more specifically to a level shift circuit in an electrically writable and erasable semiconductor device such as a nonvolatile semiconductor memory device.

2. Description of the Related Art

Conventionally, semiconductor devices such as nonvolatile semiconductor memory store information by inserting and removing electrons to and from floating gates. To accomplish this, a potential difference of approximately 20V must be given between a control gate and a drain. This, however, requires that the high voltage of the transistors used in the circuits of the semiconductor device be increased in order to operate at 20V. Transistor size thus increases.

A recent trend in semiconductor device design is to integrate a negative power supply into the semiconductor device and thereby relatively lower the power supply voltage Vdd that is used. More specifically, by lowering the power supply voltage used, the semiconductor device can be designed with low voltage transistors, and transistor size decreases as a result.

For example, 11 V is given to the drain and −9V is given to the word line to remove an electron from a floating gate. On the other hand, when an electron is not to be removed, 0V is given to the word line.

A circuit that operates at approximately 3 V (Vdd) is commonly used to control whether −9V or 0V is supplied. Therefore, either a level shifting circuit or a switching circuit for converting the control signal having 0V or 3V to a signal having 0V or −9V is needed. This type of level shifting circuit and switching circuit is well known from the literature.

It is generally not possible using a level shifting circuit to convert a plurality of control signals having a range 0V to the power supply voltage Vdd to signals having a range 0V to −9V in a single operation. An intermediate circuit for bridging these conversions is therefore needed. An optical coupling means is used as such an intermediate circuit. The optical coupling means is able to convert the control signals having a range 0V to Vdd to an optical signal. A circuit for converting to the signals having a range 0V to −9V receives the optical signals to convert the control signal. However, to incorporate an optical coupling means into a semiconductor device, a separate manufacturing process or other semiconductor is required, as a result, semiconductor device is manufactured at a high cost.

It is also possible to provide an intermediate level shifting circuit before a level shift circuit for converting to the signals having a range 0V to −9V. In this case, the control signals having a range 0V to Vdd are first converted to a signal varying from −9V to Vdd, and then the signal is converted to the signal having a range 0V to −9V by the level shifting circuit. In order to convert input signals having a range 0V to Vdd to signals having a range 0V to −9V, it is thus necessary to first use an intermediate level shifting circuit for temporarily converting to the signal having a range −9V to Vdd and for setting an area overlapping in the voltage conversion range before and after conversion.

However, for this intermediate level shifting circuit handles voltages having a range −9V to Vdd, a transistor having a high voltage (break down voltage) within a range Vdd to (Vdd+9V) must be used. Accordingly, it is impossible to achieve the objective of a low voltage.

A method of resolving this problem by using a negative power supply having −4V so that the operating voltage of the intermediate level shifting circuit is from −4V to the power supply voltage Vdd is also known from the literature.

However, because the amplitude of the intermediate level shifting circuit is from the power supply voltage Vdd to −4V, an intermediate circuit having a intermediate voltage −4V is needed. That is, while the required voltages are 0V and −9V, switching in one step from 0V to −9V is not possible. The intermediate level shifting circuit converts therefore a voltage from the power supply voltage Vdd to −4V, and then a conversion circuit (a second stage level shifting circuit) converts the intermediate voltage from 0V to −9V, to lower the required junction break down voltage level.

A level shifting circuit is therefore required for converting from the power supply voltage Vdd to −4V, and two level shifting circuits thus become necessary. A charge pump that is otherwise unnecessary is required for outputting −4V, and the required circuit scale and power consumption inevitably increase.

SUMMARY OF THE INVENTION

An object of the present invention is therefore to provide a semiconductor device comprising a level shifting circuit in which transistor high voltage is low without using an extraneous charge pump.

To achieve this object, a semiconductor device having a level shifting circuit for controlling an output signal level according to an input signal, where the level shifting circuit comprises a first-conductive type transistor to which an input signal is given, and a second-conductive type transistor to which is input the output signal from the first-conductive type transistor, is characterized according to the present invention by the level shifting circuit further comprising a control means for controlling operation of the first-conductive type transistor, and a voltage relieving means for suppressing a voltage given to the second-conductive type transistor.

Thus comprised, the operation of the first-conductive type transistor to which an input signal is given is controlled by the control means, and the voltage given to the second-conductive type transistor to which the output signal of the first-conductive type transistor is input is suppressed by the voltage suppressing means. It is therefore possible to achieve a level shifting circuit having low voltage transistors without using an otherwise unnecessary charge pump.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:

FIG. 8 is a section view of a transistor to which a high voltage is given;

FIG. 9 is a symbol chart representing a memory cell in a flash memory device, which is one application for a level shifting circuit according to the present invention;

FIG. 10 is a voltage state table for each operating mode of an FN write/FN erase flash memory device.

DESCRIPTION OF THE PREFERRED EMBODIMENTS

Figures 1, 2:
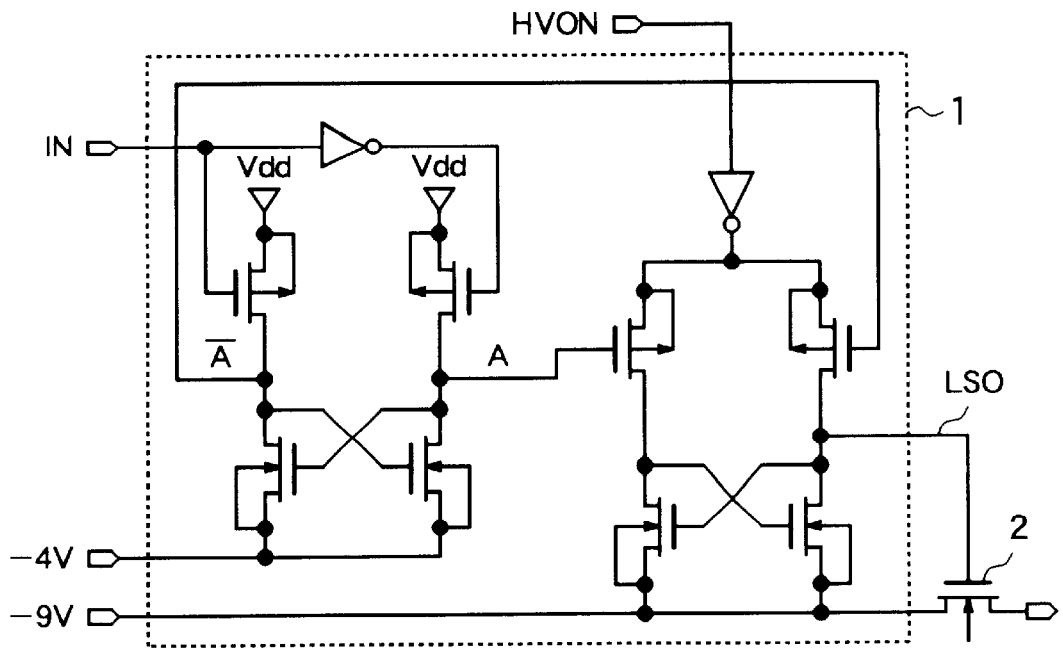
FIG. 1 is a circuit diagram showing a typical control circuit in a semiconductor device according to the related art.
FIG. 2 is a truth table for the control circuit shown in FIG. 1.

A semiconductor device according to the related art is described first below with reference to the accompanying diagrams, of which FIG. 1 is a circuit diagram showing a typical control circuit 100 in a semiconductor device according to the related art, and FIG. 2 is a truth table for the control circuit shown in FIG. 1.

As shown in FIG. 1, control circuit 100 (shown as 1 in FIG. 1) comprises level shifting circuits, each having two p-channel transistors, two n-channel transistors, and an inverter, in two stages.

A −4V charge voltage is given from a −4V charge pump to the sources of the n-channel transistors in the first level shifting circuit, and a −9V charge voltage is given from a −9V charge pump to the sources of the n-channel transistors in the second stage shifting circuit.

The state of the output signal LSO of the control circuit 100 changes according to the logic value of input signal IN such that the output signal LSO is low when input signal IN is low (L), and the output signal LSO is high when input signal IN is high. Transfer gate 200 (shown as 2 in FIG. 1), which is an n-channel transistor, is controlled by adjusting the state of the output signal LSO so that the output from the −9V charge pump is either passed or not passed through the transfer gate 200.

In other words, as shown in FIG. 2, when the −9V charge pump operates, the −4V charge pump also operates. Then, the charge voltage having −9V and −4V are respectively output from the −9V charge pump and −4V charge pump. At this time, the voltage mode selection signal HVON inputs to the second stage shifting circuit becomes high (a high voltage mode), and the sources of the p-channel transistors in the second stage shifting circuit becomes 0V.

The Node A of the level shifting circuits becomes either power supply voltage Vdd or −4V (the inverse A-bar is either −4V or the power supply voltage Vdd), and the output signal LSO becomes similarly either 0V or −9V. Thereby, the on/off state of transfer gate 2 is controlled. As a result, the transfer gate 2 thus either outputs −9V or becomes a high impedance (Hi-Z) state.

When the −9V charge pump and −4V charge pump are not operating, each output voltage thereof is 0V. The voltage mode selection signal HVON thus becomes low (a normal voltage mode), and each source voltage of the p-channel transistors in the second stage shifting circuit becomes the power supply voltage Vdd.

The Node A of the level shifting circuits becomes either power supply voltage Vdd or 0V (the inverse A-bar is either 0V or the power supply voltage Vdd), and the output signal LSO becomes similarly either power supply voltage Vdd or 0V. Thereby, the on/off state of transfer gate 2 is controlled. As a result, the transfer gate 2 thus either outputs 0V or becomes a high impedance (Hi-Z) state.

Therefore, to prevent giving excessive voltage to the PN junction of the transistors forming the level shifting circuit, the voltage mode selection signal HVON is set high and the power supply voltage Vdd at positive side of the second stage shifting circuit is set to 0V. In other words, when the voltage mode selection signal HVON is low, the second stage shifting circuit operates in the range from 0V to the power supply voltage Vdd. When the voltage mode selection signal HVON is high, it operates between 0 and −9V. Operation in the range from −9V to the power supply voltage Vdd is thus eliminated, and the high voltage of the transistors in the second stage shifting circuit, that is, the voltage given to the PN junction of the transistors, can be held to a relatively low level.

A first preferred embodiment of the present invention is described next below with reference to FIG. 3, a circuit diagram of a level shifting circuit used in a semiconductor device according to a first version of the present invention.

Figure 3:
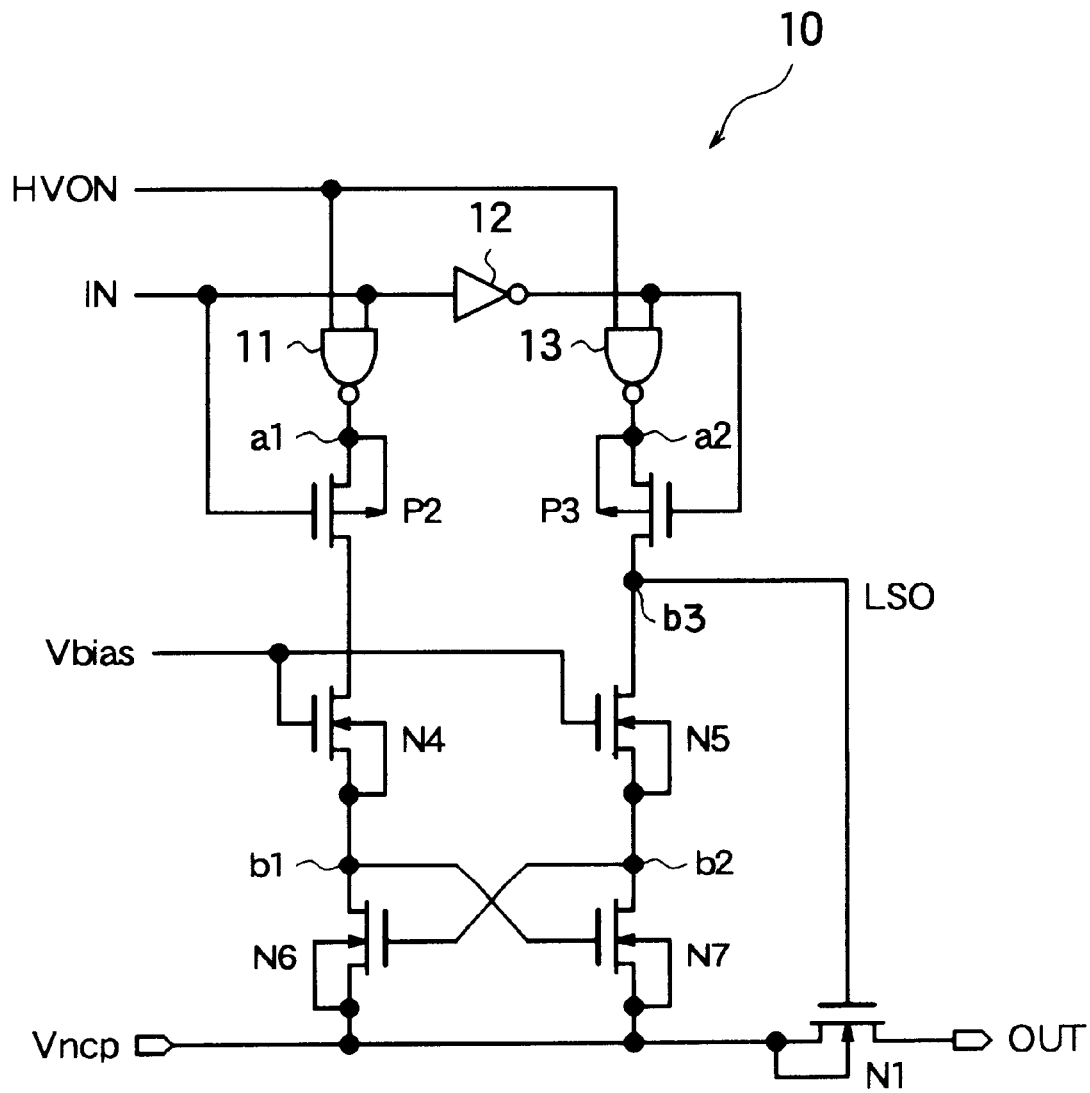
FIG. 3 is a circuit diagram showing a level shifting circuit in a semiconductor device according to a first preferred embodiment of the present invention.

The level shifting circuit shown in FIG. 3 is used, for example, in non-volatile semiconductor storage devices requiring a negative power supply voltage, and typically resides between the memory cell control circuit and charge pump circuit. Depending upon the level shifting circuit output, the transfer gate N1 controls so that a charge pump output Vncp (−9V) becomes on/off.

As shown in FIG. 3, level shifting circuit 10 controls the on/off state of the transfer gate formed by n-channel transistor N1. As shown in FIG. 3, the level shifting circuit 10 comprises a NAND gate 11, a p-channel transistor P2, a n-channel transistor N4, a n-channel transistor N6, a NAND gate 13, a p-channel transistor P3, a n-channel transistor N5, and a n-channel transistor N7.

The p-channel transistor P2, the n-channel transistor N4, and the n-channel transistor N6 are connected in series between the output of the NAND gate 11 and the −9V charge pump output Vncp.

The voltage mode selection signal HVON and the input signal IN are input to the NAND gate 13 through inverter 12. The p-channel transistor P3, the n-channel transistor N5, and the n-channel transistor N7 are connected in series between the output of the NAND gate 13 and the charge pump output Vncp.

The Node b1 is connected to the gate of the n-channel transistor N7. The Node b2 is connected to the gate of the n-channel transistor N6. The Node b3 is connected to the gate of the n-channel transistor N1. The back gate of each transistor P2, P3, and N4 to N7 is connected to the source thereof.

The input signal IN is input to the gate of the p-channel transistor P2. A bias voltage Vbias is given to the gate of the n-channel transistor N4. The charge pump output Vncp is given to the source of the n-channel transistor N6. The input signal IN is also input through inverter 12 to the gate of p-channel transistor P3. The Bias voltage Vbias is input to the gate of the n-channel transistor N5. The charge pump output Vncp is input to the source of the n-channel transistor N7 and to the source of n-channel transistor N1; output signal OUT is output from the drain of n-channel transistor N1.

Figures 4, 5:
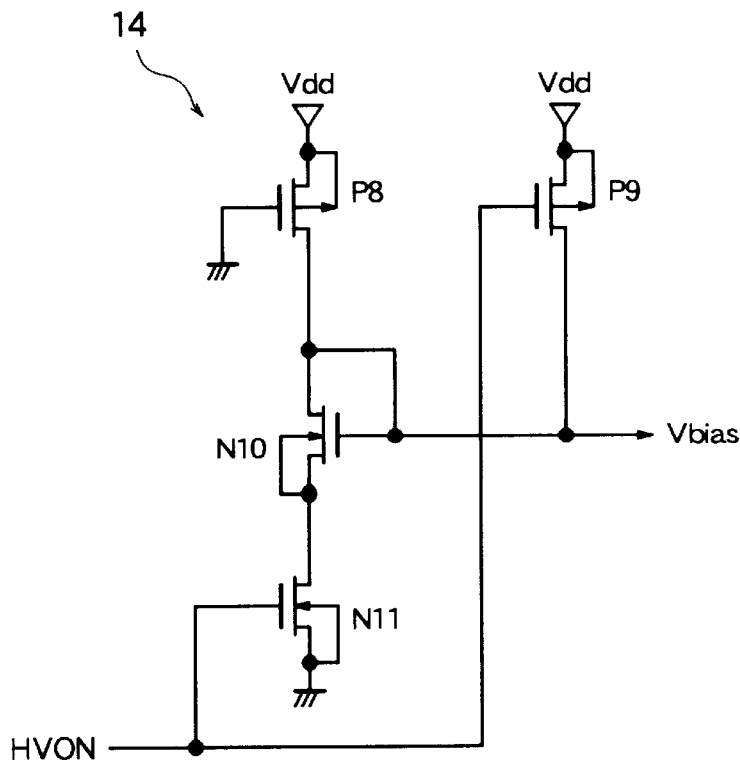
FIG. 4 is a circuit diagram of a bias voltage generating circuit for supplying a bias voltage to the level shifting circuit shown in FIG. 3.
FIG. 5 is a truth table for the level shifting circuit shown in FIG. 3.

FIG. 4 is a circuit diagram of a bias voltage generating circuit for supplying the bias voltage Vbias to the level shifting circuit shown in FIG. 3. As shown in FIG. 4, this bias voltage generating circuit 14 comprises a p-channel transistor P8, a n-channel transistor N10, and a n-channel transistor N11 in series connected between the power supply voltage Vdd and ground; and a p-channel transistor P9 connected between the power supply voltage Vdd and the gate of n-channel transistor N10.

The gate of the p-channel transistor P8 is to ground, the source is connected to the power supply voltage Vdd, and the drain is connected to the drain of the n-channel transistor N10. The drain of the n-channel transistor N10 is further connected to the gate thereof, and the source to the drain of the n-channel transistor N11. The source of the n-channel transistor N11 is to the ground, and the voltage mode selection signal HVON is input to the gate of n-channel transistor N11 and the gate of p-channel transistor P9. The potential of the drain of n-channel transistor N10 and the potential of the drain of p-channel transistor P9 are output as the bias voltage Vbias.

When the voltage mode selection signal HVON in the bias voltage generating circuit 14 is low, the n-channel transistor N11 turns off and the p-channel transistor P9 is turned on. The bias voltage Vbias therefore becomes the power supply voltage Vdd.

When the voltage mode selection signal HVON is high, the p-channel transistor P9 turns off, and the n-channel transistor N10 and the n-channel transistor N11 are turned on. The bias voltage Vbias in this case is the threshold voltage (approximately Vtn) of the n-channel transistor N10 determined by the current flow at this time.

The bias voltage Vbias is thus controlled with this circuit configuration by the voltage mode selection signal HVON, and can be set to either power supply voltage Vdd or to approximately threshold voltage Vtn. It should be noted that when the negative drive capacity of the p-channel transistor P8 is high, the same function and operation can be achieved without using the p-channel transistor P9.

FIG. 5 is a truth table for the level shifting circuit shown in FIG. 3. When the voltage mode selection signal HVON is high (selecting a high voltage mode) in level shifting circuit 10, a −9V charge pump operates, outputting the charge pump output Vncp (−9V), and the bias voltage Vbias (approximately Vth) is given.

When the input signal IN is high, the source potential a1 of the p-channel transistor P2 and the source potential a2 of the p-channel transistor P3 become 0V and the power supply voltage Vdd, respectively; when the p-channel transistor P2 turns off, the p-channel transistor P3 is turned on. As a result, the drain of the p-channel transistor P3 becomes the power supply voltage Vdd.

When the drain potential of the p-channel transistor P3 becomes the power supply voltage Vdd, the n-channel transistor N6 turns on and the drain of the n-channel transistor N4 becomes −9V. Because the n-channel transistor N7 turns off, the drain of the n-channel transistor N5 remains at the drain potential Vdd of the p-channel transistor P3.

As a result of this operation, the output signal LSO of level shifting circuit 10 becomes the power supply voltage Vdd, and the inverse of LSO (LSO-bar below), that is, the node output of transistors P2 and N4, becomes −9V. Potential b1 of the node between the n-channel transistor N4 and the n-channel transistor N6 becomes −9V at this time. The Potential b2 of the node between the n-channel transistor N5 and the n-channel transistor N7 is approximately 0V.

When the input signal IN is low, the source potential a1 of the p-channel transistor P2 and the source potential a2 of the p-channel transistor P3 become the power supply voltage Vdd and 0V, respectively; when the p-channel transistor P2 is turned on, the p-channel transistor P3 turns off. As a result, the drain of the p-channel transistor P2 becomes the power supply voltage Vdd.

When the drain potential of the p-channel transistor P2 becomes the power supply voltage Vdd, the n-channel transistor N7 turns on and the drain of the n-channel transistor N5 becomes −9V. Because the n-channel transistor N6 turns off, the drain of the n-channel transistor N4 remains at the drain potential Vdd of the p-channel transistor P2.

As a result of this operation, the output signal LSO of level shifting circuit 10 becomes −9V, and the LSO-bar becomes the power supply voltage Vdd. Potential b1 of the node between the n-channel transistor N4 and the n-channel transistor N6 becomes approximately 0V at this time. Potential b2 of the node between the n-channel transistor N5 and the n-channel transistor N7 becomes −9V.

When the voltage mode selection signal HVON is low (selecting a normal voltage mode), the outputs a1 and a2 of NAND gates 11 and 13 become the power supply voltage Vdd irrespective of the logic value of the input signal IN. The bias voltage Vbias thus becomes the power supply voltage Vdd. The charge pump therefore does not operate, and the charge pump output Vncp becomes 0V. If in this state the input signal IN becomes high, transistors P2 and N7 turn off, and P3 and N6 turn on. The output signal LSO thus becomes the power supply voltage Vdd. Conversely, if the input signal IN becomes low, the transistors P2 and N7 turn on, and the transistors P3 and N6 turn off, and the output signal LSO becomes 0V.

The output signal LSO from level shifting circuit 10 thus varies between 0V and the power supply voltage Vdd. Depending on whether the logic of the input signal IN is low or high, the output signal OUT of transfer gate N1 becomes a high impedance Hi-Z or 0V state.

However, when the voltage mode selection signal HVON is high (selecting a high voltage mode), the charge pump operates, and the charge pump output Vncp becomes −9V. The bias voltage Vbias thus becomes a voltage (approximately Vtn) near the threshold of n-channel transistors N4 and N5. When the input signal IN is low in this state, the output signal LSO of level shifting circuit 10 is −9V, and there is a 9V potential difference between the source of the n-channel transistor N7 and the substrate of the p-channel transistor P3. When the input signal IN is high, the opposite is occurs, and the output signal LSO of level shifting circuit 10 becomes the power supply voltage vdd.

As will be known from the above description, the source and back gate potential of the p-channel transistors P2 and P3 is controlled according to the input signal by means of a back gate control means formed by the NAND gates 11 and 13, and the inverter 12. This means that the source and back gate potential is 0V even when transistors P2 and P3 turn off and −9V is given to the drain thereof. Conversely, when the transistors P2 and P3 turn on, the potential difference between the drain and source is approximately 0V. That is, because the maximum potential difference that can occur between the back gate and the drain and source of the p-channel transistors P2 and P3 is 9V, the level shifting circuit can be achieved using the low voltage transistors.

A voltage relieving circuit comprising n-channel transistors N4 and N5 is also provided for relieving voltage. As a result, the maximum voltage given to the drain of the n-channel transistors N6 and N7 is the bias voltage Vbias minus threshold Vtn, that is, 0V.

Because the source and back gate of transistors N6 and N7 are −9V or 0V, a maximum of only 9V can occur between the drain of n-channel transistors N6 and N7 and the source and back gate even if transistors N6 and N7 turn off. At this time, a potential difference of the power supply voltage Vdd is the maximum that can occur between the drain of n-channel transistors N4 and N5 and the source and back gate at this time. Conversely, when the transistor N6 or N7 turns on, the potential difference between the drain and source is approximately 0V. As a result, the n-channel transistors N4, N5, N6, and N7 can be achieved using the low voltage transistors.

As will be known from the above description, the voltages a1 (Vdd and 0V) and a2 (0V and Vdd) given to the p-channel transistors, and the voltages b1 (approximately 0V and −9V) and b2 (−9V and approximately 0V) given to the n-channel transistors can be suppressed with a level shifting circuit according to this preferred embodiment of the present invention (see FIG. 5).

The amplitude of the output from level shifting circuit 10 thus ranges from the power supply voltage vdd to −9V, but the maximum voltage given to the PN junction of each transistor in the level shifting circuit 10 is approximately 9V, and the high voltage level of the junction can therefore be reduced.

It is therefore possible to eliminate the extra charge pump required for outputting −4V in a semiconductor device according to the related art, and thus use only a single level shifting circuit. Power consumption can therefore be reduced. The required transistor size can also be reduced, and the size of the final semiconductor device can therefore be reduced, because transistors with the low voltage level can be used, and transfer gate switching is possible.

Figure 6:
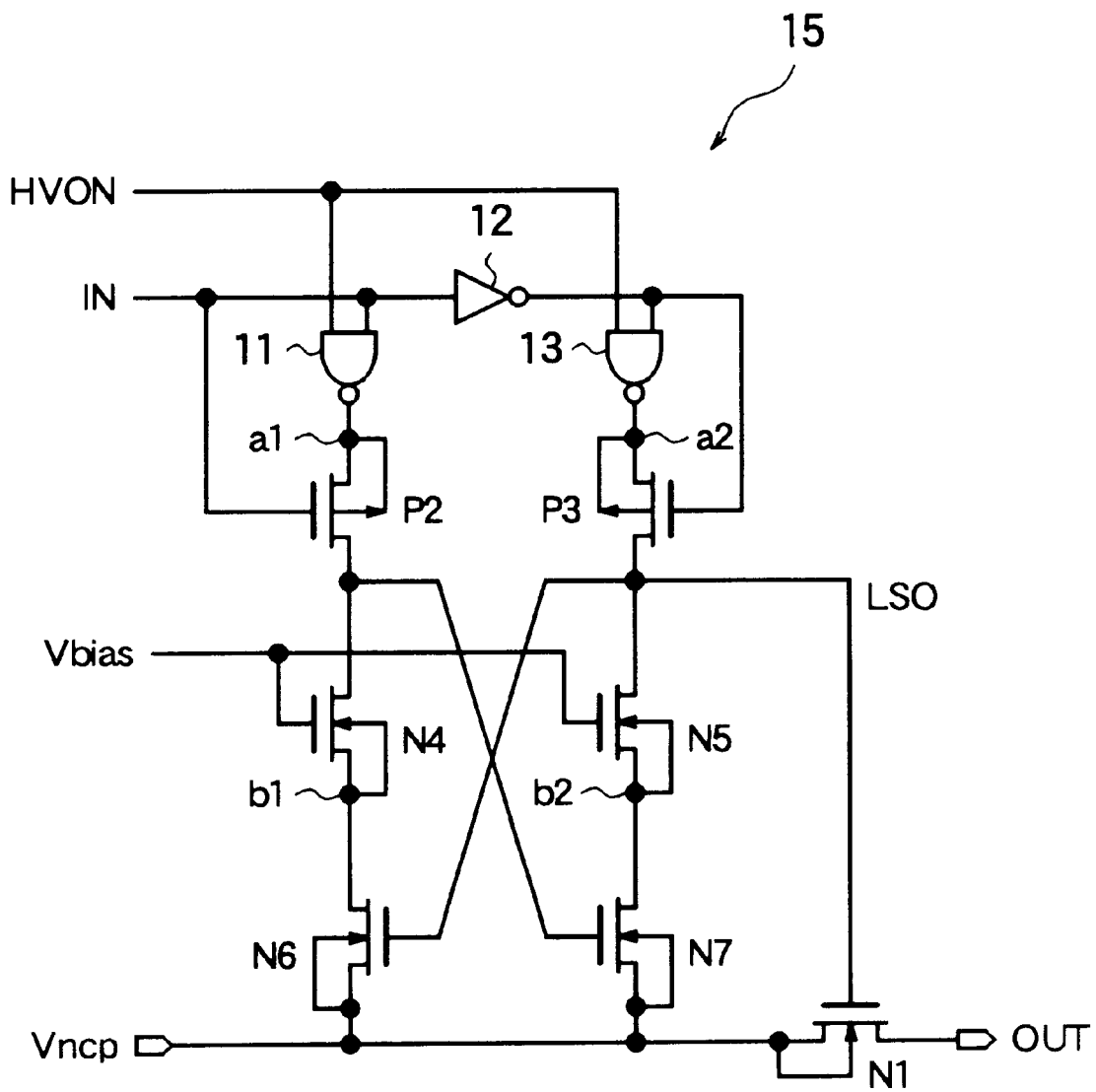
FIG. 6 is a circuit diagram showing a level shifting circuit in a semiconductor device according to a second preferred embodiment of the present invention.

A level shifting circuit used in a semiconductor device according to a second embodiment of the present invention is described next below with reference to FIG. 6. As shown in FIG. 6, a node between the p-channel transistor P2 and the n-channel transistor N4 is connected to the gate of the n-channel transistor N7 in level shifting circuit 15 according to this preferred embodiment rather than the node between the n-channel transistor N4 and the n-channel transistor N6 (FIG. 3).

In addition, a node between the p-channel transistor P3 and the n-channel transistor N5 is connected to the gate of the n-channel transistor N6 in this preferred embodiment rather than the node between the n-channel transistor N5 and the n-channel transistor N7 (FIG. 3). Other aspects of the configuration, operation, and benefits of this preferred embodiment are the same as those of the level shifting circuit 10 according to the first preferred embodiment described above, and further description thereof is thus omitted below. The truth table for this level shifting circuit 15 is also the same as shown in FIG. 5.

As described above, when the voltage mode selection signal HVON is low and the input signal IN is low in a level shifting circuit 10 according to the first preferred embodiment, both the n-channel transistor N5 and the n-channel transistor N7 must turn on for the output signal LSO to become 0V. The gate voltage Vg (N7) of the n-channel transistor N7 can therefore be represented as shown in equation 1.

$$Vg(N7) \approx Vbias - Vtn(N4)$$
$$= Vdd - Vtn(N4) > Vtn(N7)$$

That is, the power supply voltage Vdd must be greater than the sum of Vtn(N4) and Vtn(N7). If both Vtn(N4) and Vtn(N7) are approximately 1 V, the bottom limit for the power supply voltage Vdd is 2 V, and the level shifting circuit will not be well suited for low voltage operation.

With a level shifting circuit 15 according to this preferred embodiment as shown in FIG. 6, however, a high level is supplied through the p-channel transistor P2 to the Vg(N7) gate when voltage N is low. The power supply voltage Vdd is thus supplied as the bias voltage Vbias to the gate of the n-channel transistor N5. The gate voltage Vg(N7) of the n-channel transistor N7 thus becomes substantially to the power supply voltage Vdd, and must be greater than threshold value Vtn(N7). For example, if Vtn(N7) is approximately 1 V, the power supply voltage Vdd will be low level (approximately 1.5 V), and operation at a low voltage below 2 V is possible.

Figure 7:
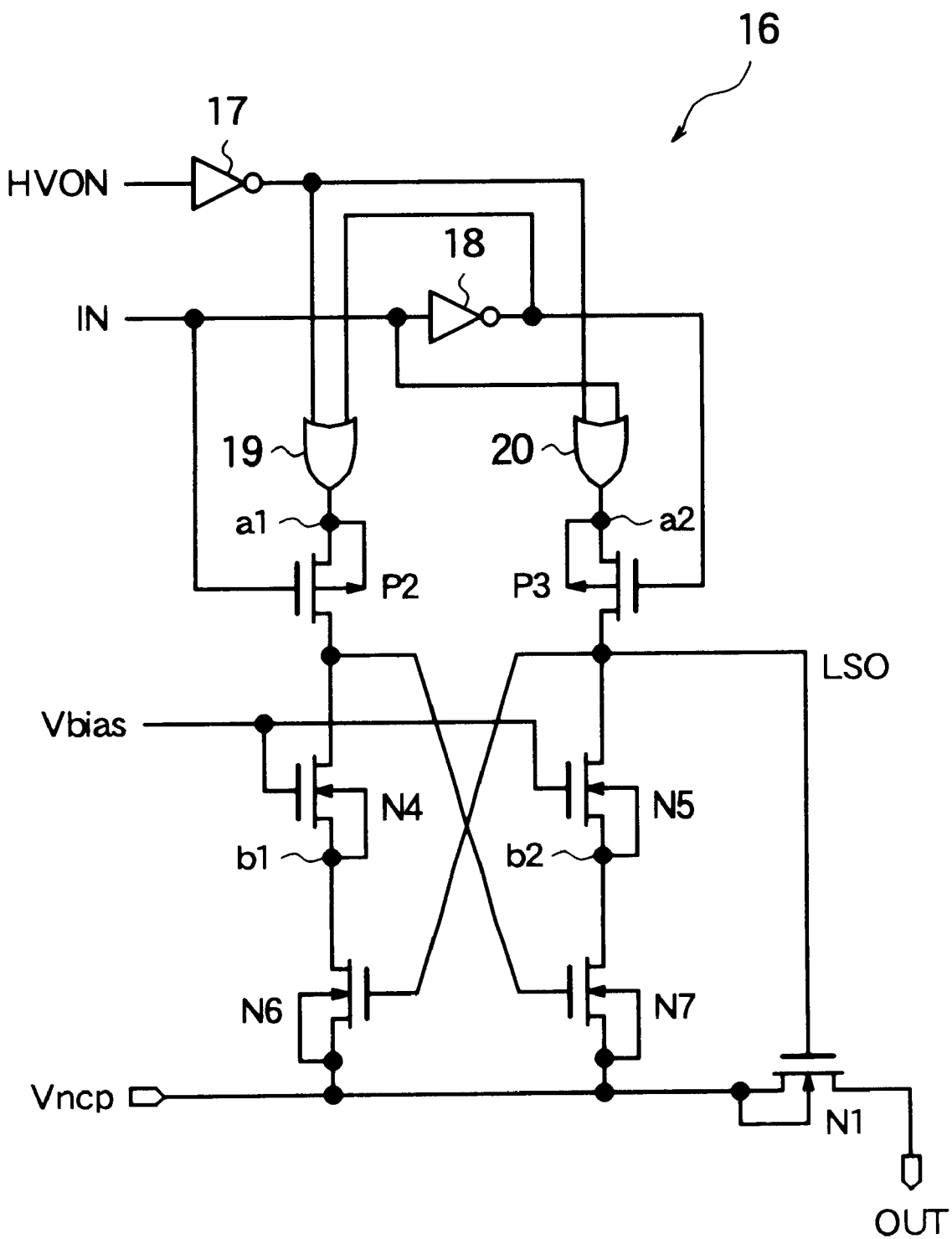
FIG. 7 is a circuit diagram showing a level shifting circuit in a semiconductor device according to a third preferred embodiment of the present invention.

A level shifting circuit used in a semiconductor device according to a third embodiment of the present invention is described next below with reference to FIG. 7. As shown in FIG. 7, this level shifting circuit 16 has a back gate control means comprising an inverter 17 through which the voltage mode selection signal HVON is input; an inverter 18 through which the input signal IN is input; an OR gate 19 to which a first input is the output of inverter 17, and a second input is the output of inverter 18; and an OR gate 20 to which a first input is the output of inverter 17, and a second input is the input signal IN. Other aspects of the configuration, operation, and benefits of this preferred embodiment are the same as those of the level shifting circuit 10 according to the first preferred embodiment described above, and further description thereof is thus omitted below. The truth table for this level shifting circuit 16 is also the same as shown in FIG. 5. As will be known from FIG. 7, a level shifting circuit according to the present invention must not necessarily comprise a NAND gate.

FIG. 8 is a section view of a transistor to which a high voltage is given. Note that of the transistors in the above-described level shifting circuits 10, 15, and 16, a high voltage is given to transistors N1, P2, P3, N4, N5, N6, N7 and N10. As will also be known from FIG. 8, the back gates of the n-channel transistors are isolated by a deep well from the substrate, enabling a negative voltage to be given.

FIG. 9 is a symbol diagram of a memory cell in a flash memory device, which is one area of application for a level shifting circuit as described in the above embodiments according to the present invention. FIG. 10 is a voltage state table for each operating mode of an FN write/FN erase flash memory device.

As shown in FIG. 10, a write mode is enabled at −9V, and erase and read modes at 0V, when compared at the low level voltages to be given to the control gate of the memory cell shown in FIG. 9. The control gate potential is controlled by a low decoder for forming a line selection signal. A circuit for applying a voltage adjusted according to the operating mode to the power supply terminal of the low decoder is also required to operate the low decoder. An exemplary application for any of the level shifting circuits 10, 15, and 16 according to the above-described preferred embodiments of the present invention is for controlling the voltage given to the low potential side power supply terminal of the low decoder according to the operating mode.

It will be noted that the present invention has been described example using a positive power supply voltage Vdd and a transfer gate for switching a negative voltage on and off, it will be obvious that the present invention can also be given using a negative power supply voltage Vdd and a transfer gate for switching a positive voltage on and off.

With a level shifting circuit according to the present invention as described above, the potential difference between the drain and the source or back gate in the first-conductive type transistor to which an input signal is given is reduced by a back gate control means. In addition, the potential difference between the drain and the source or back gate of a second-conductive type transistor is reduced by a voltage relieving means. As a result, transistors with a low voltage level can be used.

Circuit scale and power consumption can also be reduced because an extra charge pump is not needed, an intermediate level shifting circuit is not needed, and a single-stage level shifting circuit can be used. In addition, a high voltage with polarity opposite the power supply voltage Vdd can be switched using a transfer gate with a level shifting circuit comprising low voltage transistors.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A level shifting circuit for a semiconductor device, comprising:
   a first input port configured to receive a voltage mode selection signal, the voltage mode selection signal being set to one of a first logic level and a second logic level;
   a second input port configured to receive a bias voltage, the bias voltage being set to one of a power supply voltage and a transistor threshold voltage;
   a third input port configured to receive a charge pump voltage, the charge pump voltage being set to one of a predetermined negative voltage and a ground voltage;
   a fourth input port configured to receive an input signal, the input signal being set to one of the first logic level and the second logic level;
   a first pair of transistors of a first conductivity type;
   back gate control means which controls back gates of the first pair of transistors, the back gate control means receiving the input signal and the voltage mode selection signal;
   a second pair of transistors of a second conductivity type, the second pair of transistors connected in series with the first pair of transistors, respectively, and the second pair of transistors connected to receive the bias voltage; and
   a third pair of transistors of the second conductivity type, the third pair of transistors connected in series with the second pair of transistors, respectively, and the third pair of transistors connected to receive the charge pump voltage,
   wherein an output of the level shifting circuit is taken from a node that connects the one of the first pair of transistors with the one of the second pair of transistors.

2. A level shifting circuit according to claim 1, further comprising:
   a transfer gate that is connected to one of the first pair of transistors, one of the second pair of transistors, and to the third pair of transistors, wherein the transfer gate receives the charge pump voltage and outputs a signal that is in one of a high impedance state and a ground voltage.

3. A level shifting circuit according to claim 1, wherein the back gate control means comprises:

an inverter that receives the input signal and that outputs an inverted signal;
   a first NAND gate that receives the input signal on a first input port thereof and that receives the voltage mode selection signal on a second input port thereof, the first NAND gate outputting a first back gate control signal to a back gate of another of the first pair of transistors; and
   a second NAND gate that receives the inverted signal a first input port thereof and that receives the voltage mode selection signal on a second input port thereof, the second NAND gate outputting a second back gate control signal to a back gate of the one of the first pair of transistors.

4. A level shifting circuit according to claim 3, wherein the another of the first pair of transistors has a source, a gate, a drain, and the back gate, in which the source and the back gate are coupled together, and
   wherein the one of the first pair of transistors has a source, a gate, a drain, and the back gate, in which the source and the back gate are coupled together.

5. A level shifting circuit according to claim 4, wherein another of the second pair of transistors has a source, a gate, a drain, and the back gate, in which the source and the back gate are coupled together, and
   wherein the one of the second pair of transistors has a source, a gate, a drain, and the back gate, in which the source and the back gate are coupled together.

6. A level shifting circuit according to claim 5, wherein the bias voltage is provided to the back gates of each of the second pair of transistors.

7. A level shifting circuit according to claim 6, wherein each of the third pair of transistors has a source, a gate, a drain, and the back gate, in which the source and the back gate are coupled together,
   wherein the back gate of one of the third pair of transistors is coupled to the drain of the other of the third pair of transistors, and
   wherein the back gate of the other of the third pair of transistors is coupled to the drain of the one of the third pair of transistors.

8. A level shifting circuit according to claim 1, wherein, when the voltage mode selection signal is set at the first logic level that is of a lower level than the second logic level, the output of the level shifting circuit becomes one of a bias voltage and the charge pump voltage, based on whether the input signal is in the first logic level or the second logic level.

9. A level shifting circuit according to claim 8, wherein, when the voltage mode selection signal is set at the second logic level, the output of the level shifting circuit becomes one of the charge pump voltage and a power supply voltage, based on whether the input signal is in the first logic level or the second logic level.

10. A level shifting circuit according to claim 9, wherein the bias voltage is provided by a bias voltage generating circuit that comprises a plurality of transistors, the bias voltage generating circuit receiving the voltage mode selection signal and the power supply voltage, and outputting the bias voltage that corresponds to one of the power supply voltage and the transistor threshold voltage that is at a voltage level less than the power supply voltage.

11. A level shifting circuit for a semiconductor device, comprising:
   a first input port configured to receive a voltage mode selection signal, the voltage mode selection signal being set to one of a first logic level and a second logic level;

a second input port configured to receive a bias voltage, the bias voltage being set to one of a power supply voltage and a transistor threshold voltage;

a third input port configured to receive a charge pump voltage, the charge pump voltage being set to one of a predetermined negative voltage and a ground voltage;

a fourth input port configured to receive an input signal, the input signal being set to one of the first logic level and the second logic level;

a first pair of transistors of a first conductivity type;

back gate control means which controls back gates of the first pair of transistors, the back gate control means receiving the input signal and the voltage mode selection signal;

a second pair of transistors of a second conductivity type, the second pair of transistors connected in series with the first pair of transistors, respectively, and the second pair of transistors connected to receive the bias voltage;

a third pair of transistors of the second conductivity type, the third pair of transistors connected in series with the second pair of transistors, respectively, the third pair of transistors also connected to the first pair of transistors, respectively, and the third pair of transistors connected to receive the charge pump voltage; and a transfer gate that is connected to one of the first pair of transistors, one of the second pair of transistors, and to the third pair of transistors, wherein the transfer gate receives the charge pump voltage and outputs a signal that is in one of a high impedance state and a ground voltage, wherein an output of the level shifting circuit is taken from a node that connects the one of the first pair of transistors with the one of the second pair of transistors.

12. A level shifting circuit according to claim 11, wherein the back gate control means comprises:

an inverter that receives the input signal and that outputs an inverted signal;

a first NAND gate that receives the input signal on a first input port thereof and that receives the voltage mode selection signal on a second input port thereof, the first NAND gate outputting a first back gate control signal to a back gate of another of the first pair of transistors; and a second NAND gate that receives the inverted signal a first input port thereof and that receives the voltage mode selection signal on a second input port thereof, the second NAND gate outputting a second back gate control signal to a back gate of the one of the first pair of transistors.

13. A level shifting circuit according to claim 12, wherein the another of the first pair of transistors has a source, a gate, a drain, and the back gate, in which the source and the back gate are coupled together, and wherein the one of the first pair of transistors has a source, a gate, a drain, and the back gate, in which the source and the back gate are coupled together.

14. A level shifting circuit according to claim 13, wherein another of the second pair of transistors has a source, a gate, a drain, and the back gate, in which the source and the back gate are coupled together, and wherein the one of the second pair of transistors has a source, a gate, a drain, and the back gate, in which the source and the back gate are coupled together.

15. A level shifting circuit according to claim 14, wherein the bias voltage is provided to the back gates of each of the second pair of transistors.

16. A level shifting circuit according to claim 15, wherein each of the third pair of transistors has a source, a gate, a drain, and the back gate, in which the source and the back gate are coupled together, wherein the back gate of one of the third pair of transistors is coupled to the drain of the other of the first pair of transistors, and wherein the back gate of the other of the third pair of transistors is coupled to the drain of the one of the first pair of transistors.

17. A level shifting circuit according to claim 11, wherein, when the voltage mode selection signal is set at the first logic level that is of a lower level than the second logic level, the output of the level shifting circuit becomes one of a bias voltage and the charge pump voltage, based on whether the input signal is in the first logic level or the second logic level.

18. A level shifting circuit according to claim 17, wherein, when the voltage mode selection signal is set at the second logic level, the output of the level shifting circuit becomes one of the charge pump voltage and a power supply voltage, based on whether the input signal is in the first logic level or the second logic level.

19. A level shifting circuit according to claim 18, wherein the bias voltage is provided by a bias voltage generating circuit that comprises a plurality of transistors, the bias voltage generating circuit receiving the voltage mode selection signal and the power supply voltage, and outputting the bias voltage that corresponds to one of the power supply voltage and the transistor threshold voltage that is at a voltage level less than the power supply voltage.

20. A level shifting circuit according to claim 11, wherein the back gate control means comprises:

a first inverter that receives the input signal and that outputs an inverted input signal;

a second inverter that receives the voltage mode selection signal and that outputs an inverted selection signal;

a first NAND gate that receives the inverted input signal on a first input port thereof and that receives the inverted selection signal on a second input port thereof, the first NAND gate outputting a first back gate control signal to a back gate of another of the first pair of transistors; and a second NAND gate that receives the input signal a first input port thereof and that receives the inverted selection signal on a second input port thereof, the second NAND gate outputting a second back gate control signal to a back gate of the one of the first pair of transistors.

* * * * *